United States Patent [19]

Yamamoto et al.

[11] Patent Number: 4,703,393

[45] Date of Patent: Oct. 27, 1987

[54] MOUNTING STRUCTURE OF FLAT-LEAD PACKAGE-TYPE ELECTRONIC COMPONENT

[75] Inventors: Tsuyoshi Yamamoto, Yokohama; Nobuhide Okada, Kawasaki; Yasuo Kawamura, Hachioji, all of Japan

[73] Assignee: Fujitsu Ltd., Kawasaki, Japan

[21] Appl. No.: 757,308

[22] Filed: Jul. 22, 1985

[30] Foreign Application Priority Data

Jul. 24, 1984 [JP] Japan .................................. 59-153403

[51] Int. Cl.⁴ ............................................ H01L 23/02
[52] U.S. Cl. ............................... 361/405; 174/52 FP; 357/70
[58] Field of Search ............... 174/52 FP; 357/69, 70, 357/74; 361/405

[56] References Cited

U.S. PATENT DOCUMENTS 3,588,618  6/1971  Otte .................................. 357/74 X

FOREIGN PATENT DOCUMENTS 57-155758  9/1982  Japan .................................. 357/74

Primary Examiner—Laramie E. Askin
Assistant Examiner—David A. Tone
Attorney, Agent, or Firm—Staas & Halsey

[57] ABSTRACT

A mounting structure of a flat-lead package-type electronic component wherein ends of lead terminals drawn out from a surface of a package are bent to be horizontal with respect to the plane of the package and other portions of said lead terminal are tilted inward by a desired angle with respect to the normal of the plane.

5 Claims, 7 Drawing Figures

MOUNTING STRUCTURE OF FLAT-LEAD PACKAGE-TYPE ELECTRONIC COMPONENT

BACKGROUND OF THE INVENTION

1. Field of the Invention

The present invention relates to a mounting structure of an electronic component, more particularly, to a mounting structure of a flat-lead package-type (FLP) electronic component on a printed wiring board.

2. Description of the Related Art

Many electronic components arranged on printed wiring boards are constructed as dual in-line package types and flat-lead package types. Recently, these electronic components have been becoming increasingly dense in structure and thus give off high amounts of heat during operation.

In order to dissipate the heat from the electronic components, a cooling mechanism, such as a heat sink, is arranged at the top of the package.

However, the cooling mechanism acts as a load on the electronic components, particularly the soldered lead terminal portions of flat-lead package types on the printed wiring board, resulting in cracks and separation of the soldered lead portions.

SUMMARY OF THE INVENTION

An object of the present invention is to eliminate the above-mentioned problems.

Another object of the present invention is to provide a mounting structure of a flat-lead package-type electronic component on, for example, a printed wiring board, which strengthens the connections of the lead terminals of the component with the board.

Still another object of the present invention is to provide a mounting structure of a flat-lead package-type electronic component which decreases the load on lead terminals of an electronic component due to a cooling mechanism on the upper surface thereof.

To attain the objects of the present invention there is provided a mounting structure of a flat-lead package-type electronic component wherein ends of lead terminals drawn out from a surface of a package are bent to be horizontal with respect to the plane of the package and others portions of the lead terminals are tilted inward by a desired angle with respect to the longitudinal axis normal of the plane.

DESCRIPTION OF THE PREFERRED EMBODIMENTS

Before explaining the preferred embodiments of the present invention, the related art will be described in more detail.

Figure 1:
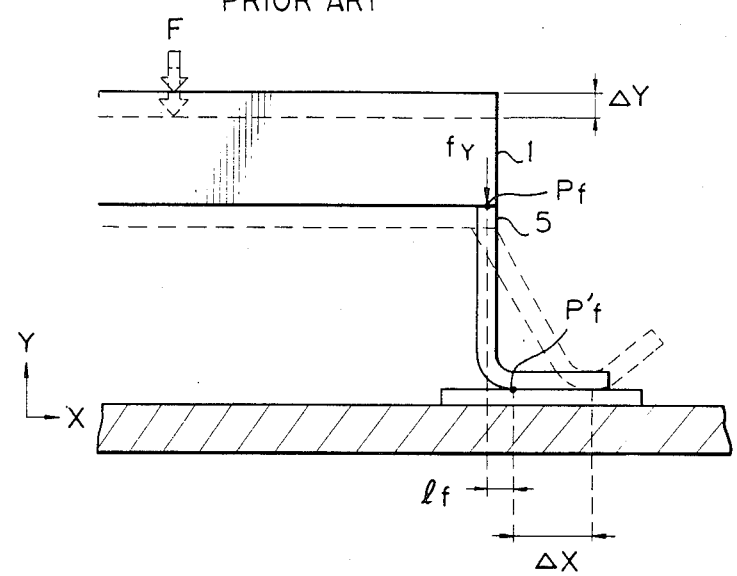
FIG. 1 is a partial schematic view explaining breakage at a soldered lead portion of a FLP electronic component.

FIG. 1 is a partial schematic view explaining breakage at a soldered lead portion of an FLP electronic component. In FIG. 1, illustration of solder connecting the lead terminal with the printed wiring board is omitted for simplification.

As shown in FIG. 1, an FLP electronic component 1 is usually subjected to a load force F due to, for example, a heat sink and a coolant of the component. When the load force F acts on the FLP electronic component 1, the FLP electronic component 1 is displaced or is depressed by $\Delta Y$ in the vertical direction (Y direction) and a lead terminal 5 is displaced by $\Delta X$ in the horizontal direction (X direction) until a balance of force is established. The displacements $\Delta Y$ and $\Delta X$ are determined by a distance $l_f$ between a point $P_f$ where the component force $f_y$ of the load F acts on the lead terminal 5 and a point $P'_f$ where the component force fy is supported. The distance $l_f$ is a distance in the direction of X and shows a negative polar character on the left side with respect to the point $P'_f$.

Figure 2:
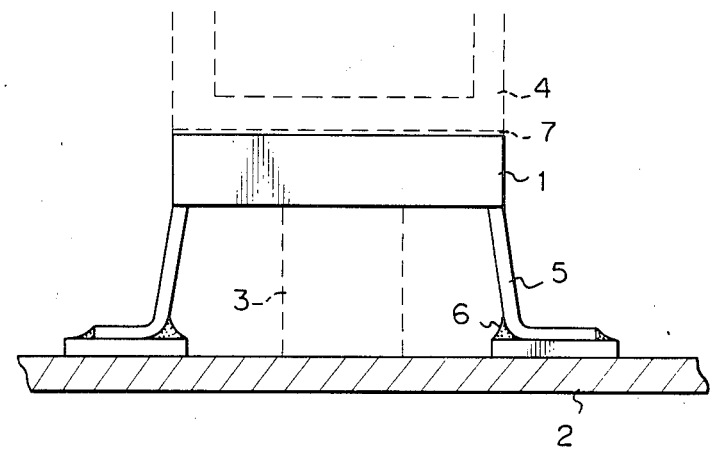
FIG. 2 is a schematic view of a cooling mechanism of an FLP electronic component.

To support the load force F, a reinforcement 3 may be provided between the FLP electronic component 1 and the printed wiring board 2, as shown in FIG. 2. However, to match the gap precisely, an exact size of the reinforcement 3 is required. In FIG. 2, reference numerals 4 and 7 designate a heat sink and thermal seat respectively.

Figure 3:
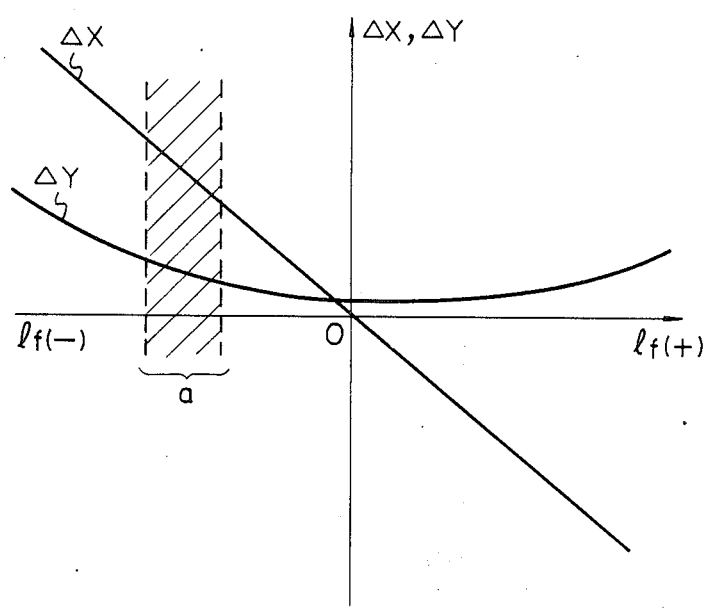
FIG. 3 is a graph explaining the pressure resistance of lead terminals.

FIG. 3 is a graph explaining a load on a soldered lead portion using displacement of the lead terminal.

As shown in FIG. 3, when the distance $l_f$ is lengthened, the displacement $\Delta X$ becomes three to four times the displacement $\Delta Y$. Namely, in a conventional lead terminal, the distance $l_f$ corresponds to area a. If the solder cannot absorb displacement $\Delta X$, cracks occur at the soldered portion, resulting in breakage.

Preferred embodiments of the present invention will now be explained.

Figure 4:
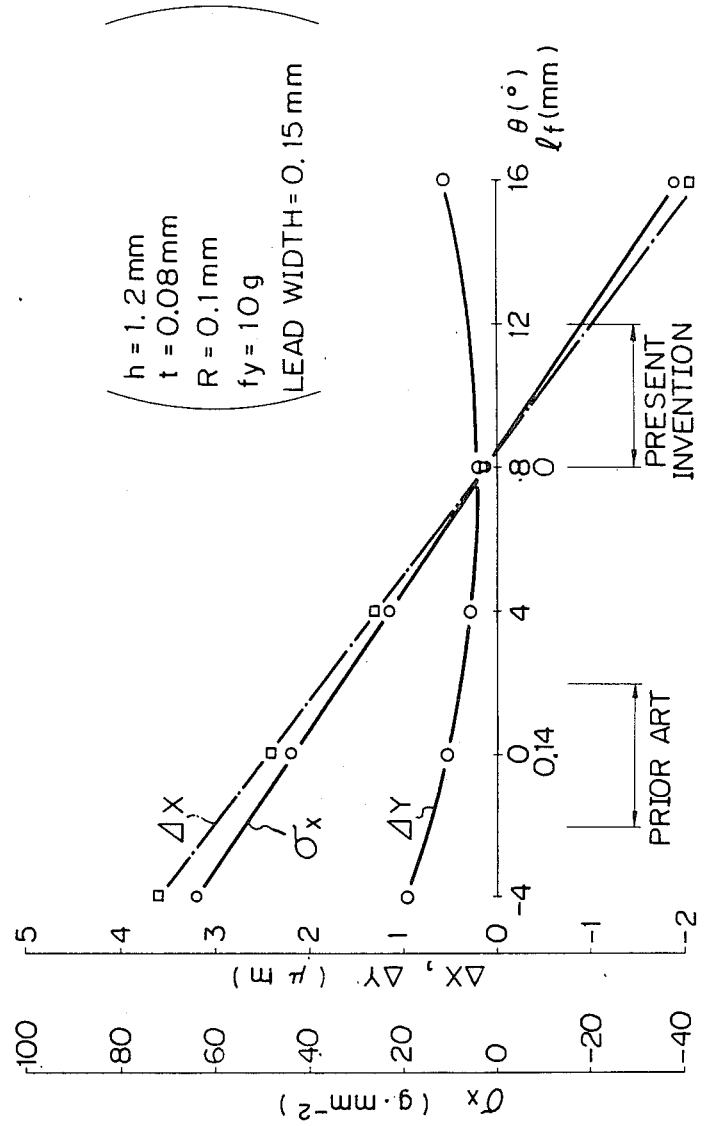
FIG. 4 is a graph explaining the pressure resistance of lead terminals using a concrete example of the present invention.

FIG. 4 is a graph explaining the pressure resistance of lead terminals with vertical portions bent at various angles with respect to the normal of the plane of the printed wiring board.

In FIG. 4, $\sigma_x$ is stress which occurrs on the soldered portion and corresponds to pressure applied on an electronic component.

$\Delta X$ and $\Delta Y$ are the same as explained in FIG. 3. When the angle $\theta$ is substantially equal to zero, as in the conventional case, the value of $\sigma_x$ becomes larger as the angle $\theta$ is smaller. As shown in FIG. 4, the value of $\Delta Y$ substantially becomes minimum at the angle of $\theta_0$. $\theta_0$ is a value of $$\tan^{-1} \frac{l_p + R + t/2}{h - t - R}$$

in a case where $l_f = 0$.

In this embodiment, an FLP electronic component having the condition h=1.2 mm, t=0.08 mm, R=0.1 mm, $f_y$=10 g was used.

Figure 5:
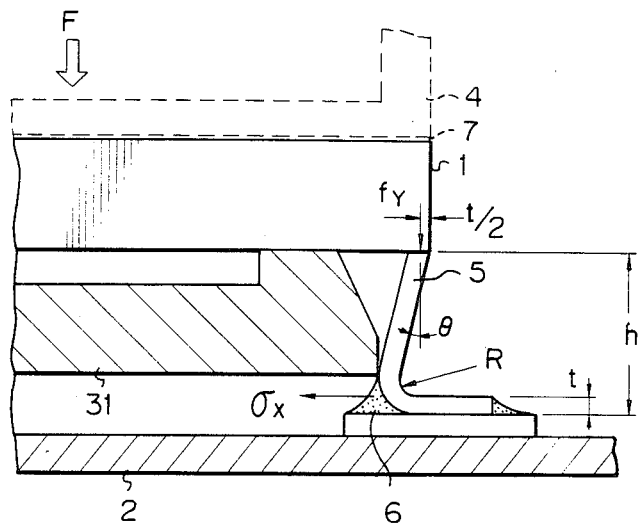
FIG. 5 is a partial schematic view of an embodiment according to the present invention.

Marks h, t and R are shown in FIG. 5.

FIG. 5 is a partial schematic view of an embodiment according to the present invention.

In FIG. 5, an FLP electronic component 1 having a heat sink 4 and tilted lead terminal 5 is arranged on a printed wiring board 2 through a soldered portion (fillet) 6. The tilting angle $\theta$ of lead terminal 5 from the normal to the plane of the component 1 corresponds to that in FIG. 4. In this case, the lead terminal 5 is bent toward the inside of the FLP electronic component 1.

Figure 6:
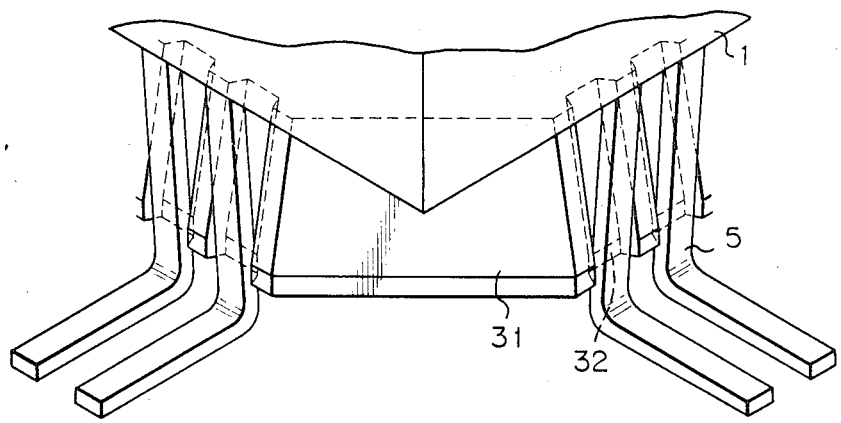
FIG. 6 is a perspective view of a part of FIG. 5.

At the back surface of the FLP electronic component 1, a reinforcement member 31 is provided. This contacts the lead terminal 5 to reinforce the same. In FIG. 6, the method of contact of the reinforcement member 31 with the lead terminals 5 can be seen. As shown in FIG. 6 the lead terminals 5 contact the reinforcement member 31 at grooves 32 formed at the sides thereof.

The lead force F due to provision of a heat sink 4 on the upper surface of the FLP electronic component 1 acts on a soldered portion 6 through the lead terminal 5 with a component force $f_y$.

The main stress $\sigma_x$ becomes zero when the expression $$\theta = \tan^{-1} \frac{l_f + R + t/2}{h - t - R},$$

is satisfied. The expression is a simple expression in a case where $\theta$ is small. In this expression, $l_f$ is zero, of course. When the angle $\theta$ is larger than the angle $\theta_0$, the stress $\sigma_x$ acts on the soldered portion toward the inside of the FLP electronic component 1. However this stress $\sigma_x$ is decreased by the reinforcement member 31. The reinforcement member 31 not only reinforces the bond strength of the soldered portion, but also the tilting angle of lead terminals by supporting it by the surface of groove 32. Further, the reinforcement member 31 need not be a precise size as understood from FIG. 5.

Figure 7:
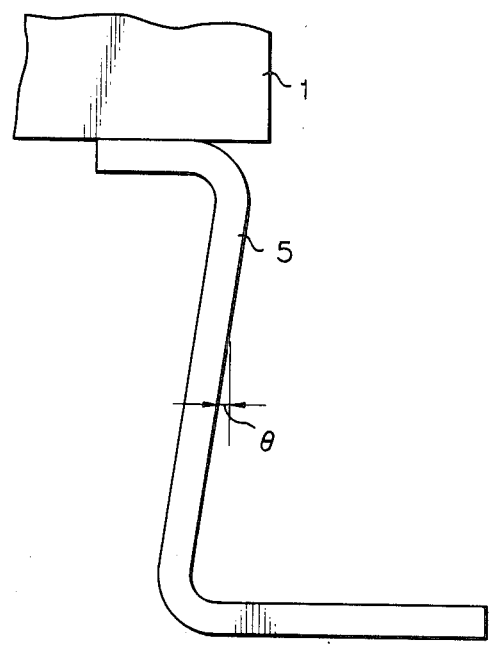
FIG. 7 is a schematic view of another embodiment according to the present invention.

The lead terminals may be bent at upper portions thereof as shown in FIG. 7.

We claim:

1. A mounting structure of a flat-lead package-type electronic component comprising: lead terminals having ends drawn out from a surface of a package and bent to be horizontal with respect to the plane of the package and other portions of said lead terminal tilted inwardly by a desired angle with respect to the normal of the plane, and a printed wiring board on which said component is arranged and a reinforcement member contacting said lead terminals and provided in a gap formed between said electronic component and said printed wiring board.

2. A mounting structure of a flat-lead package-type electronic component according to claim 1, wherein said reinforcement member has grooves provided at the sides thereof and said reinforcement member contacts said lead terminals at said grooves.

3. A mounting structure of a flat-lead package-type electronic component according to claim 1, wherein said desired angle is $$\tan^{-1} \frac{R + t/2}{h - t - R},$$

wherein R is a radius of curvature of a lead, h is a height of the lead, and t is a thickness of the lead.

4. A mounting structure of a flat-lead package-type electronic component according to claim 1, wherein said reinforcement member reinforces said lead terminals.

5. A mounting structure of a flat-lead package-type electronic component according to claim 1, wherein said reinforcement member forms said desired angle of said lead terminals.

* * * * *

UNITED STATES PATENT AND TRADEMARK OFFICE
CERTIFICATE OF CORRECTION

PATENT NO. : 4,703,393

DATED : October 27, 1987

INVENTOR(S) : Tsuyoshi Yamamoto et al

It is certified that error appears in the above-identified patent and that said Letters Patent is hereby corrected as shown below:

On the title page assignee should read

--(73) Assignee: Fujitsu Limited, Kawasaki-Shi, Japan --.

Signed and Sealed this

Second Day of August, 1988

Attest:

DONALD J. QUIGG

Attesting Officer

Commissioner of Patents and Trademarks